US012735519B2

(12) United States Patent
Aihara et al.

(10) Patent No.: US 12,735,519 B2
(45) Date of Patent: Sep. 15, 2026

(54) POLYMER AND METHOD FOR PRODUCING SAME, AND RESIN COMPOSITION FOR RESIST

(71) Applicant: MARUZEN PETROCHEMICAL CO., LTD., Tokyo (JP)

(72) Inventors: Hiromichi Aihara, Ichihara (JP); Tomohiro Masukawa, Ichihara (JP)

(73) Assignee: Maruzen Petrochemical Co., Ltd., Tokyo (JP)

( * ) Notice: Subject to any disclaimer, the term of this patent is extended or adjusted under 35 U.S.C. 154(b) by 1158 days.

(21) Appl. No.: 17/629,439

(22) PCT Filed: Aug. 6, 2020

(86) PCT No.: PCT/JP2020/030120
§ 371 (c)(1),
(2) Date: Jan. 24, 2022

(87) PCT Pub. No.: WO2021/029310
PCT Pub. Date: Feb. 18, 2021

(65) Prior Publication Data

US 2022/0251267 A1 Aug. 11, 2022

(30) Foreign Application Priority Data

Aug. 9, 2019 (JP) ................................ 2019-147848

(51) Int. Cl.
*C08F 8/12* (2006.01)
*C08F 220/28* (2006.01)
*G03F 7/038* (2006.01)
*G03F 7/039* (2006.01)

(52) U.S. Cl.
CPC ............ *C08F 220/281* (2020.02); *C08F 8/12* (2013.01); *G03F 7/038* (2013.01); *G03F 7/039* (2013.01)

(58) Field of Classification Search
CPC ...... C08F 220/281; C08F 8/12; C08F 212/14; C08F 212/22; C08F 212/24; G03F 7/038; G03F 7/039; G03F 7/16; G03F 7/0392; G03F 7/004
See application file for complete search history.

(56) References Cited

U.S. PATENT DOCUMENTS 4,877,843 A * 10/1989 Gupta ...................... C08F 8/12 525/344
5,087,772 A 2/1992 Sheehan et al.
5,861,231 A 1/1999 Barclay et al.
6,045,970 A 4/2000 Choi
6,869,748 B2 3/2005 Takeda et al.
7,834,113 B2 * 11/2010 Sounik ..................... C08F 8/14 526/218.1
9,291,898 B2 3/2016 Yokokawa et al.
9,915,870 B2 3/2018 Takizawa et al.
2004/0023153 A1 * 2/2004 Takeda ................. G03F 7/0392 430/311
2011/0086986 A1 4/2011 Masunaga et al.
2015/0147688 A1 5/2015 Yokokawa et al.
2015/0185610 A1 7/2015 Hirano et al.
2019/0276575 A1 9/2019 Kaneko et al.

FOREIGN PATENT DOCUMENTS

JP 2-311505 * 12/1990
JP H02-311505 A 12/1990
JP H04-211258 A 8/1992
JP H04-283529 A 10/1992
JP H06-017384 B2 3/1994
JP H10-186665 A 7/1998
JP H11-310611 A 11/1999
JP 2001-281864 A 10/2001
JP 2004-45448 * 2/2004
JP 2004-045448 A 2/2004
JP 2007-86284 * 4/2007
JP 2007-086284 A 4/2007
JP 2009-86354 * 4/2009
JP 2009-086354 A 4/2009
JP 2011-102386 A 5/2011
JP 2011-138107 A 7/2011
JP 2014-041328 A 3/2014

(Continued)

OTHER PUBLICATIONS

Japanese Office Action (with English translation) dated May 7, 2024 (Application No. 2021-539241).
Japanese Office Action (Application No. 2021-539241) dated Aug. 2, 2024 (with English translation) (9 pages).
Taiwanese Office Action (with English translation) dated Oct. 9, 2024 (Application No. 109126501).
Korean Office Action (with English translation) dated Oct. 23, 2024 (Application No. 10-2021-7042360).
Taiwanese Office Action (Application No. 109126501) dated Feb. 17, 2023 (with English translation).

(Continued)

*Primary Examiner* — Kumar R Bhushan
(74) *Attorney, Agent, or Firm* — Muncy, Geissler, Olds & Lowe, P.C.

(57) ABSTRACT

[Problem to be Solved]

The present invention provides a polymer comprising a structural unit derived from p-hydroxystyrene and a structural unit having a structure in which a carboxylic acid is protected by an acetal group, wherein the structural unit generated by elimination of the acetal group or migration of the acetal group during the production process is extremely small; and a process for producing the same.

[Means for Solving the Problem]

A solution containing a polymer comprising a structural unit derived from p-acetoxystyrene and a structural unit having a structure in which a carboxylic acid is protected by an acetal group is subjected to deprotection reaction at 50° C. or lower in the presence of a base in which a pKa of a conjugated acid is 12 or more.

14 Claims, No Drawings

(56) References Cited

FOREIGN PATENT DOCUMENTS

| | | | |
|---|---|---|---|
| TW | 200407671 | A | 5/2004 |
| TW | 201411285 | A | 3/2014 |
| TW | 201412785 | A | 4/2014 |
| TW | 201437747 | A | 10/2014 |
| WO | 2018/079203 | A1 | 5/2018 |

OTHER PUBLICATIONS

Korean Office Action (with English translation) dated Jun. 23, 2025 (Application No. 10-2021-7042360).

Taiwanese Office Action (with English translation) dated Mar. 13, 2025 (Application No. 109126501).

*Vinylphenol Basics and Applications*, Maruzen Petrochemical Co., Ltd. (with English translation).

International Search Report and Written Opinion (Application No. PCT/JP2020/030120) dated Oct. 20, 2020 (with English translation).

Chinese Office Action (Application No. 202080050200.1) dated Oct. 11, 2022 (with English translation).

Chinese Office Action (with English translation) dated Sep. 9, 2023 (Application No. 202080050200.1).

English translation of International Preliminary Report on Patentability (Chapter I) (Application No. PCT/JP2020/030120) Feb. 17, 2022, 7 pages.

Canadian Office Action (Application No. 3,148,747) dated Jun. 26, 2024 (4 pages).

Canadian Office Action dated Jun. 17, 2025 (Application No. 3,148,747).

Taiwanese Office Action (Application No. 114100901) dated Jul. 22, 2025 (with English translation) (10 pages).

Taiwanese Office Action (with English translation) dated Dec. 22, 2025 (Application No. 114100901).

* cited by examiner

POLYMER AND METHOD FOR PRODUCING SAME, AND RESIN COMPOSITION FOR RESIST

FIELD OF THE INVENTION

The present invention relates to a polymer and a method for producing the same. More particularly, the present invention relates to a polymer containing a structural unit derived from p-hydroxystyrene and a structural unit having a structure in which a carboxylic acid is protected by an acetal group, and a method for producing the same. The present invention also relates to a resin composition for a resist containing the polymer.

BACKGROUND ART

Conventionally, fine processing by lithography using a photoresist composition is performed in a manufacturing process of a semiconductor device such as an IC or an LSI. In recent years, as integrated circuits have been highly integrated, there has been a demand for formation of an ultra-fine pattern in a sub-micron region or a quarter micron region, and KrF excimer lasers and ArF excimer lasers having shorter wavelengths than g-lines and i-lines have been used as exposure light sources in mass production of semiconductors. Furthermore, lithography techniques using electron beams, X-rays, or extreme ultraviolet (EUV) light are currently being developed.

The lithography using electron beam, X-ray or EUV is positioned as a next generation or next generation pattern forming technique, and there is a desire for a resist composition having high sensitivity and high resolution. In particular, in order to shorten the wafer processing time, it is very important to make the resist having a high sensitivity; however, there is a trade-off between sensitivity and resolution, and it is strongly desired to develop a resist composition that satisfies these characteristics simultaneously.

Patent Document 1 proposes, a polymer containing a structural unit having a phenolic hydroxyl group and a structural unit having a structure in which carboxylic acid is protected by an acetal group, as a resist polymer for lithography using electron beam or EUV. The polymer is synthesized by directly polymerizing a monomer having a phenolic hydroxyl group (for example, p-hydroxystyrene or 4-hydroxyphenyl methacrylate) with a monomer having a structure in which a carboxylic acid is protected by an acetal group. However, p-hydroxystyrene has low stability and is known to cause problems such as polymerization during storage (Non-Patent Document 1), and thus it is difficult to produce on an industrial scale by the above-mentioned method.

As another method for producing a polymer having a p-hydroxystyrene unit, there are known methods (Patent Documents 2 and 3) in which, in place of p-hydroxystyrene, tertiary butoxystyrene or acetoxystyrene is used as a used as a raw material for polymerization, followed by removal of a tertiary butyl group or acetyl group.

Generally, a base resin for a chemically amplified resist has a structure in which an acidic group such as a carboxyl group is protected by a protecting group (hereinafter referred to as an acid-releasing group) which is eliminated by the action of an acid. As described above, when a copolymer containing a p-hydroxystyrene unit and a structural unit having an acid-releasing group is to be synthesized using tertiary butoxystyrene or acetoxystyrene as a starting material, it is necessary to desorb only the hydroxystyrene protecting group in the deprotection step after polymerization and maintain the other structures having an acid-releasing group. If the acid-leaving group is eliminated, there are problems such as the portion where the solubility decreases of the resin in the developing solution changes due to exposure, the development contrast between the exposed portion and the unexposed portion decreases, or strong acid such as a carboxylic acid is generated in the polymer due to the elimination of the acid-leaving group, and the film loss in the unexposed portion increases during the alkali development. Further, there is a concern that the storage stability of the polymer may be deteriorated by the carboxylic acid formed in the polymer.

Patent Document 4 discloses a method in which a deprotection reagent selected from primary or secondary amine compounds having a ClogP value of 1.00 or less (wherein the secondary amine compound has two carbon atoms bonded to the nitrogen atom of the amino group that are not tertiary) is used as a method for desorbing an acyl group in a shorter period of time in deprotection reaction of a polymer containing a unit structure having a phenolic hydroxyl group protected by an acyl group while preserving other partial structures.

PRIOR ART DOCUMENTS

Patent Documents

Patent Document 1: Japanese Unexamined Patent Application Publication No. 2014-41328

Patent Document 2: Japanese Unexamined Patent Application Publication No. H04-211258

Patent Document 3: Japanese Unexamined Patent Application Publication No. H10-186665

Patent Document 4: Japanese Unexamined Patent Application Publication No. 2011-102386

Non-Patent Document

Non-Patent Document 1: Vinylphenol Basics and Applications (by Maruzen Petrochemical Co., Ltd.)

SUMMARY OF THE INVENTION

Problem to be Solved by the Invention

However, the effect of the deprotection method disclosed in Patent Document 4 has been confirmed for a polymer having an ester structure derived from an aliphatic alcohol as the structure of an acid-releasing group, and the method disclosed in Patent Document 4 has not been sufficient for a polymer containing a unit structure having an acetal-type acid-releasing group that is easy to be desorbed and has a lower activation energy in an elimination reaction.

The present invention provides a polymer containing a structural unit derived from p-hydroxystyrene and a structural unit having a structure in which a carboxylic acid is protected by an acetal group, and having very few structural units generated by elimination of an acetal group or migration of an acetal group during the production process, and a process for producing the same.

Means for Solving the Problem

As a result of intensive studies to solve the above-mentioned problems, the present inventors have found that by subjecting a polymer containing a structural unit derived from p-acetoxystyrene and a structural unit having a structure in which a carboxylic acid is protected by an acetal group to deprotection reaction in an organic solvent in the presence of a base in which a pKa of a conjugated acid is 12 or more at a temperature of 0° C. to 50° C., only the acyl group of the acetoxystyrene unit can be deprotected while suppressing elimination or migration of the acetal group, thereby completing the present invention.

That is, according to the present invention, the following inventions are provided.

[1] A method for producing a polymer comprising a structural unit derived from p-hydroxystyrene and a structural unit having a structure in which a carboxylic acid is protected by an acetal group, wherein the method is characterized in that the polymer comprising a structural unit derived from p-acetoxystyrene and a structural unit having a structure in which a carboxylic acid is protected by an acetal group is subjected to a deprotection reaction in an organic solvent in the presence of a base in which the pKa of the conjugated acid is 12 or more at a temperature within the range of 0° C. to 50° C. to convert the structural unit derived from p-acetoxystyrene in the polymer into a structural unit derived from p-hydroxystyrene.

[2] The method for producing a polymer according to [1], wherein the structural unit having a structure in which a carboxylic acid is protected by an acetal group is a structural unit represented by Formula (II):

(II)

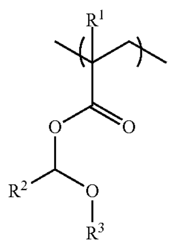

wherein $R^1$ represents a hydrogen atom or a methyl group, and $R^2$ represents an alkyl group having 1 to 10 carbon atoms. $R^3$ represents an alkyl group having 1 to 15 carbon atoms, a saturated aliphatic cyclic group having 5 to 15 carbon atoms, an aryl group having 6 to 15 carbon atoms, an alkylaryl group having 7 to 15 carbon atoms, or an aralkyl group having 7 to 15 carbon atoms. $R^2$ and $R^3$ may be bonded together to form a 5- to 8-membered heterocyclic group together with an oxygen atom to which $R^3$ is bonded.

[3] The method for producing a polymer according to [1] or [2], wherein the base in which the pKa of the conjugated acid is 12 or more is at least one selected from the group consisting of sodium hydroxide, potassium hydroxide, sodium methoxide, potassium methoxide, and diazabicycloundecene.

[4] The method for producing a polymer according to any one of [1] to [3], wherein the organic solvent used in the deprotection reaction is at least one selected from the group consisting of methanol, ethanol, isopropanol, propylene glycol monomethyl ether, methyl acetate, ethyl acetate, isopropyl acetate, propyl acetate, methyl propionate, ethylene glycol monomethyl ether acetate, ethylene glycol monoethyl ether acetate, and propylene glycol monomethyl ether acetate.

[5] The method for producing a polymer according to any one of [1] to [4], wherein the deprotection reaction is carried out at a temperature of 20° C. to 50° C.

[6] A polymer having a structural unit represented by Formula (I):

(I)

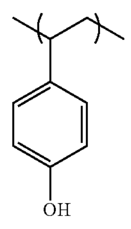

and Formula (II):

(II)

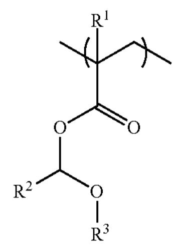

wherein, $R^1$ represents a hydrogen atom or a methyl group, and $R^2$ represents an alkyl group having 1 to 10 carbon atoms. $R^3$ represents an alkyl group having 1 to 15 carbon atoms, a saturated aliphatic cyclic group having 5 to 15 carbon atoms, an aryl group having 6 to 15 carbon atoms, an alkylaryl group having 7 to 15 carbon atoms, or an aralkyl group having 7 to 15 carbon atoms. $R^2$ and $R^3$ may be bonded together to form a 5- to 8-membered heterocyclic group together with an oxygen atom to which $R^3$ is bonded, characterized in that, the total of the structure represented by Formula (III):

(III)

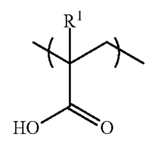

wherein, $R^1$ is the same as $R^1$ in Formula (II), and the structural unit represented by Formula (IV):

(IV)

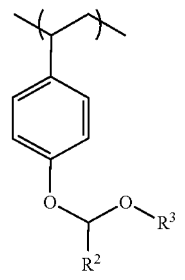

wherein, $R^2$ and $R^3$ are the same as $R^2$ and $R^3$ in Formula (II), is 1 mol % or less based on the total 100 mol % of all the structural units.

[7] A resin composition for a resist, comprising the polymer according to [6].

Effect of the Invention

According to the present invention, it is possible to produce a polymer containing a structural unit derived from p-hydroxystyrene and a structural unit having a structure in which a carboxylic acid is protected by an acetal group, and having very few structural units resulting from elimination of an acetal group and migration of an acetal group. In addition, the polymer is useful as a polymer for a chemically amplified resist having high sensitivity, high resolution, and good storage stability.

MODE FOR CARRYING OUT THE INVENTION

[Method for Producing Polymer]

A polymer produced by the production method of the present invention is a polymer containing a structural unit derived from p-hydroxystyrene and a structural unit having a structure in which a carboxylic acid is protected by an acetal group.

The structural unit derived from p-hydroxystyrene is represented by Formula (I):

(I)

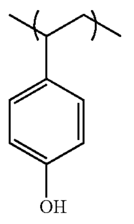

The proportion of the structural unit represented by Formula (I) contained in the polymer is preferably 1 mol % or more and 99 mol % or less, more preferably 10 mol % or more and 90 mol % or less, and even more preferably more than 30 mol % and 70 mol % or less with respect to the total 100 mol % of all structural units.

A structural unit having a structure in which a carboxylic acid is protected by an acetal group is not particularly limited, and examples thereof include a structural unit produced by vinyl addition polymerization of a monomer in which carboxyl group, such as an acrylic acid, a methacrylic acid, and 5-norbornene-2-carboxylic acid, is acetal protected. Preferably, the structural unit is derived from an acetalized product of an acrylic acid or a methacrylic acid. Especially, a structural unit represented by the following Formula (II) is preferable.

(II)

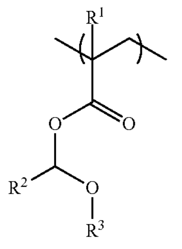

In formula (II), $R^1$ represents a hydrogen atom or a methyl group.

$R^2$ represents an alkyl group having 1 to 10 carbon atoms, preferably an alkyl group having 1 to 4 carbon atoms, and more preferably a methyl group.

$R^3$ represents an alkyl group having 1 to 15 carbon atoms, an aliphatic cyclic group having 5 to 15 carbon atoms, an aryl group having 6 to 15 carbon atoms, or an aralkyl group having 7 to 15 carbon atoms. $R^2$ and $R^3$ may be bonded to each other to form a 5- to 8-membered heterocyclic group together with an oxygen atom to which $R^3$ is bonded.

The alkyl group preferably has 2 to 10 carbon atoms and more preferably 2 to 6 carbon atoms, and may be linear or branched.

The aliphatic cyclic group preferably has 5 to 12 carbon atoms and more preferably 5 to 10 carbon atoms, and specific examples thereof include a monocyclic group such as a cyclopentyl group, a cyclohexyl group and a cyclooctyl group, or a group obtained by removing one hydrogen atom from a polycyclic aliphatic compound such as norbornane, bicyclo[4.3.0]nonane, decalin and adamantane.

The aryl group preferably has 6 to 12 carbon atoms and more preferably 6 to 10 carbon atoms, and specific examples thereof include a phenyl group, a tolyl group, a xylyl group, a naphthyl group, and an anthracenyl group.

The aralkyl group preferably has 7 to 13 carbon atoms and more preferably 7 to 11 carbon atoms, and specific examples thereof include a benzyl group, phenylethyl group, 2-phenyl-2-propyl group, naphthylmethyl group, naphthylethyl group, 2-naphthyl-2-propyl group, and the like.

Specific examples of the heterocyclic group formed by bonding $R^2$ and $R^3$ to each other include a tetrahydrofuranyl group, tetrahydropyranyl group, oxepanyl group, oxocanyl group.

The proportion of the structural unit represented by formula (II) contained in the polymer is preferably from 1 mol % or more and 99 mol % or less, more preferably 10 mol % or more and 90 mol % or less, and even more preferably 30 mol % or more and 70 mol % or less with respect to the total 100 mol % of all structural units.

When the acetal portion of the structural unit represented by formula (II) is eliminated, a structural unit represented by formula (III) is formed as a by-product in the polymer.

(III)

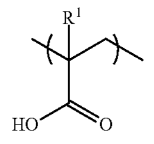

In Formula (III), the definition of $R^1$ is the same as in Formula (II).

In addition, the eliminated acetal may bond to the phenolic hydroxyl group of the p-hydroxystyrene unit to form a structural unit represented by formula (IV) as a by-product in the polymer.

(IV)

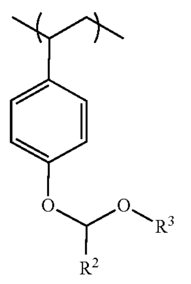

In Formula (IV), the definitions and preferred embodiments of $R^2$ and $R^3$ are the same as in Formula (II).

When a structural unit represented by Formula (III) or Formula (IV) is formed as a by-product in the polymer, resist performance such as the development speed may deviate from the desired value. In addition, further elimination of the acetal-type protecting group of the unit represented by Formula (II) due to the influence of the carboxylic acid can lead to deterioration of storage stability of the polymer; thus the formation of a by-products of Formula (III) or Formula (IV) should be suppressed as much as possible. Preferably, the total ratio of the structural units represented by Formula (III) or Formula (IV) contained in the polymer is 1 mol % or less, more preferably 0.5 mol % or less, and still more preferably 0.1 mol % or less with respect to the total 100 mol % of the total structural units.

The method for producing a polymer according to the present invention comprises subjecting a structural unit derived from p-acetoxystyrene in a polymer containing a structural unit derived from p-acetoxystyrene and a structural unit having a structure in which a carboxylic acid is protected by an acetal group to a deprotection reaction and converting into a structural unit derived from p-hydroxystyrene.

In the present invention, a polymer containing a structural unit derived from p-acetoxystyrene and a structural unit having a structure in which a carboxylic acid is protected by an acetal group is copolymerizable with at least p-acetoxystyrene and can also be obtained by polymerization reaction of a monomer having a structure in which a carboxylic acid is protected by an acetal group. An example of the monomer having a structure in which a carboxylic acid is protected by an acetal group includes one represented by (ii) below.

(ii)

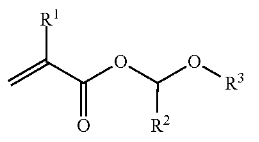

Formula (ii) is a monomer that gives a structural unit represented by Formula (II) above, and the definitions and preferred embodiments of $R^1$, $R^2$ and $R^3$ in formula (ii) are the same as those in Formula (II).

The polymer of the invention may also contain other structures. As the monomer for providing another structural unit, it is possible to use a variety of monomers used in known resist polymers in order to adjust the solubility in a resist solvent or a lithographic developer, etching resistance, substrate adhesion, and the like. Examples include styrene monomers derived from styrene, vinyl naphthalene, vinyl anthracene, and the like; various (meth)acrylic acid ester monomers derived from acrylic acid and methacrylic acid; norbornene monomers derived from norbornene, tricyclodecene, tetracyclododecene, and the like. In addition, indene, acenaphthylene, and the like can also be copolymerized.

The weight-average molecular weight (Mw) and the dispersion degree (Mw/Mn) of the polymer of the present invention can be appropriately set according to the application, and are not particularly limited. For example, the weight-average molecular weight (Mw) is preferably 1,000 to 100,000, more preferably 2,000 to 50,000, still more preferably 3,000 to 30,000, and still more preferably 5,000 to 15,000 from the viewpoint of expressing polymer properties. The dispersion degree (Mw/Mn) is preferably 1.1 to 2.0, more preferably 1.2 to 1.80, and still more preferably 1.3 to 1.7 from the viewpoint of equalizing the properties of the polymer.

In the present invention, the weight-average molecular weight (Mw) and the dispersion degree (Mw/Mn) of the polymer are values measured by gel permeation chromatography (GPC) and can be measured under measurement conditions described later.

(Polymerization Reaction)

Polymerization reaction in the production method of the present invention is not particularly limited, and conventionally known polymerization methods such as radical polymerization, cationic polymerization, and living anionic polymerization can be applied.

In the case of a radical polymerization method, polymerization is carried out by heating and stirring in a state in which a raw material monomer, a radical polymerization initiator, optionally a chain transfer agent and the like are dissolved in a solvent, preferably in an inert gas atmosphere such as nitrogen. For example, polymerization can be carried out by a so-called bulk polymerization method in which all raw materials such as a monomer, a polymerization initiator, a chain transfer agent and the like are dissolved in a solvent and heated to a polymerization temperature, a method in which a polymerization initiator and the like are added after the monomer is dissolved in the solvent and heated to a polymerization temperature, or a so-called dropwise addition polymerization method in which a solution obtained by dissolving a monomer, a polymerization initiator and the like in a solvent is dropped into a solvent heated to a polymerization temperature. Among them, the dropwise addition polymerization method is preferable because of its high reproducibility for each production lot, and particularly, a so-called independent dropping method is preferred in which a monomer and a polymerization initiator which is a radical generation source are dropped separately. A part of each of the monomer, polymerization initiator, chain transfer agent and the like may be supplied in advance into the polymerization system. In the dropping method, the monomer concentration and radical concentration in the polymerization system can be adjusted by changing the composition of the supplied monomer solution or the supply speed of the monomer solution or polymerization initiator, thereby controlling the dispersion degree and composition distribution of the copolymer to be formed.

As for the radical polymerization initiator, it is possible to use conventionally known products such as an azo polymerization initiator or a peroxide polymerization initiator. Specific examples of the azo polymerization initiator include 2,2'-azobisisobutyronitrile, 2,2'-azobis(2-methylbutyronitrile), dimethyl 2,2'-azobis(2-methylpropionate), 1,1'-azobis (cyclohexane-1-carbonitrile), 4,4'-azobis (4-cyanovaleric acid), and the like. The polymerization initiator of an azo compound is preferable from the viewpoint of excellent handling safety. Specific examples of the peroxide-based polymerization initiator include decanoyl peroxide, lauroyl peroxide, benzoyl peroxide, bis(3,5,5-trimethyl hexanoyl) peroxide, succinate peroxide, tert-butyl peroxy-2-ethyl hexanoate, tert-butyl peroxypivalate, 1,1,3,3-tetramethylbutyl peroxy-2-ethyl hexanoate, and the like. These polymerization initiators may be used alone or in a mixture. The amount of the polymerization initiator used may be selected according to the desired molecular weight and types of monomer, polymerization initiator, chain transfer agent, solvent and the like, structural unit composition, polymerization temperature, the dropping rate and the like.

As the chain transfer agent, a known chain transfer agent can be used if necessary. Among these, a thiol compound is preferable, and a wide range of known thiol compounds can be selected. Specific examples include t-dodecyl mercaptan, mercaptoethanol, mercaptoacetic acid, and mercaptopropionic acid. A thiol compound having a structure in which a 2-hydroxy-1,1,1,3,3,3-hexafluoro-2-propyl group is bonded to a saturated aliphatic hydrocarbon is particularly preferable because it has an effect of suppressing roughness and defects of a lithographic pattern. The amount of the chain transfer agent used can be selected according to the target molecular weight, and the types of monomer, polymerization initiator, chain transfer agent and solvent, the structural unit composition, the polymerization temperature, and the dropping rate.

The solvent used in the polymerization reaction is not particularly limited as long as it is a solvent capable of stably dissolving the raw material monomer, the polymerization initiator, the chain transfer agent, and the polymerizable compound. Specific examples of the polymerization solvent include ketones such as acetone, methyl ethyl ketone, methyl isobutyl ketone, methyl isoamyl ketone, methyl amyl ketone and cyclohexanone; alcohols such as methanol, ethanol and isopropanol; ether alcohols such as ethylene glycol monomethyl ether, ethylene glycol monoethyl ether, propylene glycol monomethyl ether and propylene glycol monoethyl ether; esters such as methyl acetate, ethyl acetate, isopropyl acetate, propyl acetate, butyl acetate, methyl propionate, methyl lactate and ethyl lactate; ether esters such as ethylene glycol monomethyl ether acetate, ethylene glycol monoethyl ether acetate, propylene glycol monomethyl ether acetate and propylene glycol monoethyl ether acetate; ethers such as tetrahydrofuran, 1,4-dioxane and ethylene glycol dimethyl ether; aromatic hydrocarbons such as toluene and xylene; N,N-dimethylformamide and acetonitrile.

These may be used alone or in a mixture of two or more. It is also possible to use a mixture of compounds having a high solubility of the monomer, the polymerization initiator, the chain transfer agent, and the polymerization reaction product, and a high boiling point, such as ethylene glycol monobutyl ether, 3-methoxy-3-methyl-1-butanol, 3-methoxy-3-methyl-1-butyl acetate, ethyl 3-ethoxypropionate, γ-butyrolactone, diethylene glycol dimethyl ether, N-methylpyrrolidone, or dimethyl sulfoxide.

The amount of the polymerization solvent used is not particularly limited, but if the amount of the solvent used is too small, the monomer may precipitate or become too viscous to keep the polymerization system uniform, and if it is too large, the conversion ratio of the monomer may be insufficient or the molecular weight of the copolymer may not be increased to the desired value. Usually, the amount is 0.5 to 20 parts by weight, preferably 1 to 10 parts by weight per 1 parts by weight of the monomer.

In the dropwise addition polymerization method, the amount of a solvent that is pre-filled in a reaction tank (hereinafter sometimes referred to as an initially filled solvent) may be equal to or more than the minimum amount that allows stirring, but if it is more than necessary, the amount of the monomer solution that can be supplied decreases, leading to reduction in the production efficiency which is not preferable. Usually, it is selected from the range of, for example, 1/30 or more, preferably 1/20 to 1/2, particularly preferably 1/10 to 1/3 in volume ratio with respect to the final feed amount (i.e. the total amount of the initially filled solvent, the monomer solution and the initiator solution to be dropped). A part of the monomer may be mixed in advance with the initially filled solvent.

The dropping time in the dropping polymerization method is not preferable if it is short because the dispersion degree tends to widen, or because dropping a large amount of solution at one time lowers the temperature of the polymerization solution. On the other hand, it is not preferable if it is long because the copolymer will undergo a thermal history longer than necessary and the productivity will decrease. Therefore, it is usually selected from the range of 0.5 to 24 hours, preferably 1 to 12 hours, and particularly preferably 2 to 8 hours.

After the dropping is completed and after the temperature is raised to the polymerization temperature in the bulk temperature raising method, it is preferable to carry out aging by maintaining the temperature for a certain period of time or further raising the temperature, etc. and to allow the remaining unreacted monomers to react. It is not preferable if the aging time is too long because the production efficiency per hour decreases and the copolymer will undergo a thermal history longer than necessary. Therefore, it is usually selected from the range of within 12 hours, preferably within 6 hours, particularly preferably within 1 to 4 hours.

The polymerization temperature can be appropriately selected according to the boiling point of the solvent, monomer, chain transfer agent and the like, the half-life temperature of the polymerization initiator and the like. Since polymerization does not proceed easily at a low temperature, there is a problem in productivity, and when the temperature is higher than necessary, there is a problem in terms of stability of the monomer and copolymer. Therefore, the temperature is preferably in the range of 40 to 160° C., particularly preferably 60 to 120° C. Since the polymerization temperature greatly affects the molecular weight and the copolymerization composition of the copolymer, it needs to be precisely controlled. On the other hand, since the polymerization reaction is generally an exothermic reaction and the polymerization temperature tends to rise, it is difficult to control the temperature to a constant temperature. Therefore, in the present invention, it is preferable that at least one compound having a boiling point close to the target polymerization temperature is contained as a polymerization solvent, and the polymerization temperature is set to be equal to or higher than the initial boiling point of the compound at the polymerization pressure. According to this method, it is possible to suppress an increase in the polymerization temperature due to the latent heat of vaporization of the polymerization solvent.

The polymerization pressure is not particularly limited, and may be atmospheric pressure, pressurized pressure or reduced pressure, but is usually atmospheric pressure. In the case of radical polymerization, when radicals are generated from an initiator, nitrogen gas is generated in the case of azo polymerization and oxygen gas is generated in the case of peroxide diameter; and therefore, in order to suppress the fluctuation of the polymerization pressure, it is preferable that the polymerization system is an open system and polymerization is carried out at around the atmospheric pressure.

(Purification)

When the polymer used in the present invention contains impurities such as a solvent, an unreacted monomer, an oligomer, and a reaction by-product, further purification may be performed in order to remove these impurities or to obtain a polymer having a desired dispersion degree.

Specifically, the method is performed by a method in which a solution containing a polymer is diluted by optionally adding a good solvent, then contacted with a poor solvent to precipitate the polymer, and impurities are extracted into a liquid phase (hereinafter referred to as precipitation purification), or a method in which a polymer is extracted into a good solvent phase as a liquid-liquid two phase and impurities are extracted into a poor solvent phase.

In the precipitation purification, the precipitated solid may be subjected to solid-liquid separation by a method such as filtration or decantation, and then the solid may be further washed with a poor solvent or the like. The purification may be carried out prior to the deprotection reaction or after the deprotection reaction.

The type and amount of the poor solvent and the good solvent used for the purification are not particularly limited as long as the polymer can be separated from the low molecular weight compound, and can be appropriately selected according to the solubility of the polymer in the poor solvent, the type and amount of the solvent used for the polymerization, the type and amount of impurities, and the like.

The temperature during purification needs to be strictly controlled as the temperature greatly affects the molecular weight of the polymer, the dispersion degree, and the removal rate of impurities such as residual monomer and initiator residue. It is not preferable if the purification temperature is too low because the solubility of impurities in the precipitation extraction processing solvent or the washing solvent becomes insufficient, leading to insufficient removal of impurities which is in efficient; while on the other hand, it is not preferable if it is too high because the polymer is eluted into the purification solvent, making the composition unbalanced in the low molecular weight region of the polymer or the yield lowered. Therefore, the purification is preferably carried out in the range of 0 to 80° C., and preferably in the range of 0 to 60° C.

(Deprotection Reaction)

In the deprotection reaction of the present invention, it is essential that only the acetyl group of the acetoxystyrene unit in the copolymer is deprotected while the acetal protecting group of the Formula (II) unit is not eliminated.

In the deprotection reaction of the present invention, a base in which the pKa of the conjugated acid is 12 or more is used as a catalyst. The pKa as used herein is basically a value at 25° C. in water. The base in which the pKa of the conjugated acid is 12 or more is not particularly limited, and specific examples thereof include hydroxides of alkali metals such as lithium hydroxide, sodium hydroxide and potassium hydroxide; alkoxides of alkali metals such as sodium methoxide and potassium methoxide; diazabicyclo undecene, diazabicyclo nonene, 1,5,7-triazabicyclo [4.4.0]dec-5-ene, 7-methyl-1,5,7-triazabicyclo[4.4.0]dec-5-ene, 1,1,3,3-tetramethylguanidine and the like. Among these, sodium hydroxide, potassium hydroxide, sodium methoxide, potassium methoxide and diazabicyclo undecene are preferable.

The amount of the base catalyst used varies depending on the type of base used, and thus cannot be determined unconditionally, but is usually 1 to 50 mol %, preferably 5 to 20 mol %, based on the mol number of the acetyl group to be deprotected. When the amount of the base catalyst used is within the above-mentioned ranges, a sufficient reaction rate can be easily obtained.

The temperature of the deprotection reaction is in the range of 0 to 50° C., preferably in the range of 20 to 50° C. It is unpreferable when the reaction temperature is higher than these ranges because undesirable side reactions occur, such as the reaction of the acetal group that protects the carboxylic acid with the phenolic hydroxyl group of p-hydroxystyrene, and also when the reaction temperature is lower than these ranges because deprotection reaction takes a long time and productivity is impaired.

The solvent used in the deprotection reaction is not particularly limited as long as the copolymer before deprotection and the copolymer after deprotection are solvents. Specific examples of the solvents include ketones such as acetone, methyl ethyl ketone, methyl isobutyl ketone, methyl isoamyl ketone, methyl amyl ketone and cyclohexanone; alcohols such as methanol, ethanol and isopropanol; ether alcohols such as ethylene glycol monomethyl ether, ethylene glycol monoethyl ether, propylene glycol monomethyl ether and propylene glycol monoethyl ether; esters such as methyl acetate, ethyl acetate, isopropyl acetate, propyl acetate, butyl acetate, methyl propionate, methyl lactate and ethyl lactate; ether esters such as ethylene glycol monomethyl ether acetate, ethylene glycol monoethyl ether acetate, propylene glycol monomethyl ether acetate and propylene glycol monoethyl ether acetate; ethers such as tetrahydrofuran, 1,4-dioxane and ethylene glycol dimethyl ether; aromatic hydrocarbons such as toluene and xylene; N,N-dimethylformamide, acetonitrile and the like. Among these, methanol, ethanol, isopropanol, propylene glycol monomethyl ether, methyl acetate, ethyl acetate, isopropyl acetate, propyl acetate, methyl propionate, ethylene glycol monomethyl ether acetate, ethylene glycol monoethyl ether acetate and propylene glycol monomethyl ether acetate are preferable. These may be used alone or in a mixture of two or more thereof.

After the deprotection reaction, an acid may be added to neutralize the base catalyst used in the deprotection reaction. However, care must be taken in the type and amount of the acid added to prevent acetal elimination from the polymer. Specifically, a weak acid such as oxalic acid or acetic acid is used, and the amount added is 1 to 8 mol, preferably 2 to 3 mol, per 1 mol of the base.

[Resin Composition for Resist]

The polymer obtained by the manufacturing method of the present invention is useful as a base polymer of the resin composition for a resist. The resin composition for a resist contains, in addition to the polymer, an acid generator, an acid diffusion inhibitor and a solvent capable of uniformly dissolving the acid generator and the acid diffusion inhibitor, and those conventionally known can be used. Further, the composition for a resist may optionally contain compounds commonly used as additives for a resist, such as organic carboxylic acids and phosphorus oxoacids for preventing sensitivity of the acid generator from deteriorating, improving the shape of the resist pattern and the stability of the resist pattern after exposure, additional resins for improving performance of the resist film, and surfactants, dissolution inhibitors, plasticizers, stabilizers, coloring agents, antihalation agents and dyes for improving coating properties.

EXAMPLES

The embodiments of the present invention shall be described in details below with reference to the Examples, but the present invention shall not be limited to these Examples. Unless otherwise specified in the following Examples, parts are based on mass.

The analysis of the polymer in this Example was performed as follows.

[Weight average molecular weight/dispersion degree]

The weight average molecular weight (Mw) and dispersion degree (Mw/Mn) of the polymers synthesized below were measured by GPC (gel permeation chromatography) using polystyrene as a standard. The samples for analysis were prepared in a tetrahydrofuran solution having a solid content concentration of the polymer of 2 mass %. The amount of sample injected into the device was set to 50 μl.

Measuring device: HPLC-8220 GPC manufactured by Tosoh Corporation

Detector: Differential refractive index (RI) detector

Column: Shodex GPC KF804×3 (manufactured by Showa Denko K.K.)

Eluent: tetrahydrofuran

Flow rate: 1.0 mL/min

Temperature: 40° C.

Calibration curve: Prepared using polystyrene standard sample (Tosoh Corporation)

[Polymer Composition Ratio (By-Product Content)]

The composition ratio of the polymers synthesized below was analyzed by $^{13}$C-NMR. A sample for analysis was prepared by dissolving 2.0 g of the polymer solution after deprotection reaction and subsequent neutralization reaction and 0.1 g of Cr (III) acetylacetonate in 1.0 g of heavy acetone.

Device: "AVANCE400" made by Bruker

Nuclear species: $^{13}$C

Measurement Method: Inverse Gate Decoupling

Accumulated Count: 6000 times

Measurement tube diameter: 10 mm φ

Example 1

A reaction vessel equipped with a thermometer, a cooling tube and a stirring device was charged with 71 parts of methyl ethyl ketone and heated to reflux. Another vessel was charged with 72 parts of p-acetoxystyrene (hereinafter referred to as PACS), 83 parts of 1-(butoxy)ethyl methacrylate (hereinafter referred to as BEMA), 10 parts of dimethyl-2,2'-azobisisobutyrate, and 119 parts of methyl ethyl ketone to prepare a dropping solution, which was then dropped into a reaction vessel under reflux of methyl ethyl ketone for 2 hours and reaction was done for 2 hours. A solution obtained by dissolving 3 parts of dimethyl-2,2'-azobisisobutyrate in 10 parts of methyl ethyl ketone was added to the reaction solution and allowed to react for 2 hours, followed by cooling. The polymerization solution was added dropwise to 750 parts of hexane to precipitate a polymer, stirred for 30 minutes, allowed to stand, and then decanted. The obtained polymer was dissolved in 120 parts of acetone, added dropwise to 750 parts of hexane again to precipitate a polymer, stirred for 30 minutes, allowed to stand, and then decanted. The polymer was dissolved in 300 parts of propylene glycol monomethyl ether acetate (hereinafter referred to as PGMEA) and concentrated at 40° C. under reduced pressure to adjust the polymer concentration of the polymer solution to 45 wt %.

0.1 part of a 28 mass % sodium methoxide/methanol solution was added to 11 parts of the obtained PACS/BEMA polymer solution, and the mixture was stirred at 40° C. for 4 hours to perform deprotection of PACS units. The pKa of the conjugate acid of sodium methoxide is 15.5. After the deprotection reaction, 0.5 parts of a 20 wt % acetic acid/PGMEA solution was added to neutralize, and the polymer solution was subjected to GPC analysis and NMR analysis.

The analysis results of the weight-average molecular weight, dispersion degree and structural unit composition of the obtained polymer are shown in Table 1.

Example 2

Example 2 was carried out in the same manner as in Example 1 except that the temperature of the deprotection reaction was set to 50° C. The analysis results of the weight-average molecular weight, dispersion degree and structural unit composition of the obtained polymer are shown in Table 1.

Example 3

0.4 parts of a 10 mass % potassium hydroxide/methanol solution was added to 11 parts of the PACS/BEMA resin solution obtained in Example 1, and the mixture was stirred at 40° C. for 4 hours to deprotect the PACS units. The pKa of the conjugate acid of potassium hydroxide is 15.7. After the deprotection reaction, 0.5 parts of a 20 mass % acetic acid/PGMEA solution was added to neutralize, and the polymer solution was subjected to GPC analysis and NMR analysis.

The analysis results of the weight-average molecular weight, dispersion degree and structural unit composition of the obtained polymer are shown in Table 1.

Example 4

1.6 parts of a 10 mass % diazabicycloundecene (hereinafter referred to as DBU)/methanol solution was added to 11 parts of the PACS/BEMA resin solution obtained in Example 1, and the mixture was stirred at 40° C. for 4 hours to deprotect the PACS units. The pKa of the conjugate acid of DBU is 12.5. After the deprotection reaction, 2.2 parts of a 20 mass % acetic acid/PGMEA solution was added and neutralized, and the polymer solution was subjected to GPC analysis and NMR analysis.

The analysis results of the weight-average molecular weight, dispersion degree, and structural unit composition of the obtained polymer are shown in Table 1.

Example 5

A reaction vessel equipped with a thermometer, a cooling tube and a stirring device was charged with 39 parts of methyl ethyl ketone and heated to reflux. Another vessel was charged with 37 parts of PACS, 48 parts of 1-(cyclohexyloxy)ethyl methacrylate (hereinafter referred to as CHEMA), 5 parts of dimethyl-2,2'-azobisisobutyrate, and 64 parts of methyl ethyl ketone to prepare a dropping solution, which was then dropped into a reaction vessel under reflux of methyl ethyl ketone for 2 hours, and then reaction was done for 2 hours. A solution obtained by dissolving 1 part of dimethyl-2,2'-azobisisobutyrate in 5 parts of methyl ethyl ketone was added to the reaction solution and allowed to react for 2 hours, followed by cooling. The polymerization solution was added dropwise to 375 parts of hexane to precipitate a polymer, stirred for 30 minutes, allowed to stand, and then decanted. The obtained polymer was dissolved in 60 parts of acetone, added dropwise to 375 parts of hexane again to precipitate a polymer, stirred for 30 minutes, allowed to stand, and then decanted. The polymer was dissolved in 150 parts of PGMEA, concentrated under reduced pressure at 40° C., and adjusted so that the polymer concentration of the polymer solution was 45 wt %.

0.1 part of a 28 mass % sodium methoxide/methanol solution was added to 13 parts of the obtained PACS/CHEMA polymer solution, and the mixture was stirred at 40° C. for 4 hours to perform deprotection of the PACS units. The pKa of the conjugate acid of sodium methoxide is 15.5. After the deprotection reaction, 0.5 parts of a 20 mass % acetic acid/PGMEA solution was added to neutralize, and the polymer solution was subjected to GPC analysis and NMR analysis.

The analysis results of the weight-average molecular weight, dispersion degree and structural unit composition of the obtained polymer are shown in Table 1.

Example 6

A reaction vessel equipped with a thermometer, a cooling tube and a stirring device was charged with 70 parts of methyl ethyl ketone and heated to reflux. A separate vessel was charged with 37 parts of PACS, 78 parts of tetrahydropyranyl methacrylate (hereinafter referred to as THPMA), 11 parts of dimethyl-2,2'-azobisisobutyrate, and 117 parts of methyl ethyl ketone to prepare a dropping solution, which was then dropped into a reaction vessel under reflux of methyl ethyl ketone over a period of 2 hours and then subjected to reaction for 2 hours. A solution obtained by dissolving 3 parts of dimethyl-2,2'-azobisisobutyrate in 11 parts of methyl ethyl ketone was added to the reaction solution and allowed to react for 2 hours, followed by cooling.

The polymerization solution was added dropwise to 750 parts of hexane to precipitate a polymer, stirred for 30 minutes, allowed to stand, and then decanted. The obtained polymer was dissolved in 120 parts of acetone, added dropwise to 75050 parts of hexane again to precipitate a polymer, stirred for 30 minutes, allowed to stand, and then decanted. The polymer was dissolved in 300 parts of PGMEA, concentrated under reduced pressure at 40° C., and adjusted so that the polymer concentration of the polymer solution was 45 wt %.

0.6 parts of a 28 mass % sodium methoxide/methanol solution was added to 50 parts of the obtained PACS/THPMA polymer solution, and the mixture was stirred at 40° C. for 4 hours to deprotect the PACS unit. The pKa of the conjugate acid of sodium methoxide is 15.5. After the deprotection reaction, 2.5 parts of a 20 mass % acetic acid/PGMEA solution was added and neutralized, and the polymer solution was subjected to GPC analysis and NMR analysis.

The analysis results of the weight-average molecular weight, dispersion degree, and structural unit composition of the obtained polymer are shown in Table 1.

Comparative Example 1

Comparative Example 1 was conducted in the same manner as in Example 1 except that the temperature of the deprotection reaction was set to 60° C. The analysis results of the weight-average molecular weight, dispersion degree and structural unit composition of the obtained polymer are shown in Table 1.

Comparative Example 2

Comparative Example 2 was conducted in the same manner as in Example 1 except that the temperature of the deprotection reaction was set to 80° C. The analysis results of the weight-average molecular weight, dispersion degree and structural unit composition of the obtained polymer are shown in Table 1.

Comparative Example 3

1.3 parts of a 10 mass % triethylamine/methanol solution was added to 12 parts of the PACS/BEMA polymer solution obtained in Example 1, and the mixture was stirred at 50° C. for 40 hours, and deprotection of the PACS units was conducted. The pKa of the conjugate acid of triethylamine is 10.6. The analysis results of the weight-average molecular weight, dispersion degree and structural unit composition of the obtained polymer are shown in Table 1.

Comparative Example 4

16 parts of cyclohexanone were charged into a reaction vessel equipped with a thermometer, a cooling tube and a stirring device, and heated to 85° C. 4 parts of a 50 mass % p-hydroxystyrene/cyclohexanone solution (p-hydroxystyrene was synthesized according to the Example in JPH04-283529A), 4 parts of BEMA, 0.4 parts of dimethyl-2,2'-azobisisobutyrate and 28 parts of cyclohexanone were charged into another vessel to prepare a dropping solution, which was then dropped into the reaction vessel for 2 hours, and reaction was conducted for 2 hours while maintaining 85° C., and then cooled. The polymerization solution was added dropwise to a mixed solvent of 360 parts of hexane and 40 parts of ethyl acetate to precipitate a polymer, stirred for 30 minutes, allowed to stand, and then filtered. A mixed solvent of 360 parts of hexane and 40 parts of ethyl acetate was added to the collected polymer, the slurry was stirred to wash the polymer, which was then filtered. The collected polymer was dried under reduced pressure at 40° C. over one night.

The analysis results of the weight-average molecular weight, dispersion degree and structural unit composition of the obtained polymer are shown in Table 1.

TABLE 1

| | Structural unit (I) | Structural unit (II) | De-protection conditions | | | Mw/ | structural unit composition ratio*(mol %) | | |
|---|---|---|---|---|---|---|---|---|---|
| | material | material | Base | Temperature | Mw | Mn | (I) | (II) | (III) + (IV) |
| Ex. 1 | PACS | BEMA | NaOMe | 40° C. | 9,930 | 1.47 | 50.6 | 49.4 | 0.0 |
| Ex. 2 | PACS | BEMA | NaOMe | 50° C. | 9,800 | 1.47 | 53.4 | 46.6 | 0.0 |
| Ex. 3 | PACS | BEMA | KOH | 40° C. | 9,930 | 1.45 | 53.3 | 46.7 | 0.0 |
| Ex. 4 | PACS | BEMA | DBU | 40° C. | 9,910 | 1.45 | 53.4 | 46.6 | 0.0 |
| Ex. 5 | PACS | CHEMA | NaOMe | 40° C. | 8,700 | 1.47 | 55.9 | 44.1 | 0.0 |
| Ex. 6 | PACS | THPMA | NaOMe | 40° C. | 8,170 | 1.70 | 52.3 | 47.7 | 0.0 |
| Comp. Ex. 1 | PACS | BEMA | NaOMe | 60° C. | 9,800 | 1.47 | 53.4 | 43.3 | 3.3 |
| Comp. Ex. 2 | PACS | BEMA | NaOMe | 80° C. | 9,520 | 1.46 | 53.9 | 33.3 | 12.8 |
| Comp. Ex. 3 | PACS | BEMA | TEA | 50° C. | 9,760 | 1.42 | 43.9 | 45.1 | 11.0 |
| Comp. Ex. 4 | PHS | BEMA | — | — | 9,800 | 1.52 | 40.6 | 58.3 | 1.1 |

*Composition ratio of structural units represented by chemical Formulae (I) to (IV) in the specification.

[Storage Stability Test]

The polymer solutions obtained in Example 1 and Comparative Example 1 were each stored at 20° C., and the transition of the total content of structural unit (III) and structural unit (IV) in the polymer was examined. The results are shown in Table 2.

TABLE 2

| | Composition ratio of structural units (III) + (IV)*(mol %) | | | |
|---|---|---|---|---|
| | 0 week | 1 week after | 2 weeks after | 4 weeks after |
| Ex. 1 | 0.0 | 0.0 | 0.0 | 0.0 |
| Comp. Ex. 1 | 3.3 | 3.5 | 3.5 | 3.7 |

The polymer produced by the method of the present invention was highly inhibited in the formation of a carboxylic acid structural unit by the elimination of an acetal protecting group and the formation of a structural unit in which the eliminated acetal group was reacted with a phenolic hydroxyl group of a hydroxystyrene unit. In addition, the composition of such a polymer did not change even after storage at 20° C. for 4 weeks, and storage stability was excellent.

INDUSTRIAL APPLICABILITY

The polymer of the present invention can be used as a highly sensitive resin composition for a resist.

The invention claimed is:

1. A method for producing a polymer comprising a structural unit derived from p-hydroxystyrene and a structural unit having a structure in which a carboxylic acid is protected by an acetal group, wherein the method is characterized by the steps of:

providing a polymer comprising a structural unit derived from p-acetoxystyrene and a structural unit having a structure in which a carboxylic acid is protected by an acetal group, and subjecting the polymer, while dissolved in an organic solvent, to a deprotection reaction in the presence of a base in which a pKa of a conjugated acid is 12 or more at a temperature within the range of 0° C. to 40° C. to convert the structural unit derived from p-acetoxystyrene in the polymer into a structural unit derived from p-hydroxystyrene.

2. The method for producing a polymer according to claim 1, wherein the structural unit having a structure in which a carboxylic acid is protected by an acetal group is a structural unit represented by Formula (II):

(II)

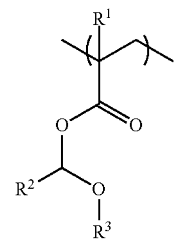

wherein $R^1$ represents a hydrogen atom or a methyl group, and $R^2$ represents an alkyl group having 1 to 10 carbon atoms, $R^3$ represents an alkyl group having 1 to 15 carbon atoms, a saturated aliphatic cyclic group having 5 to 15 carbon atoms, an aryl group having 6 to 15 carbon atoms, an alkylaryl group having 7 to 15 carbon atoms, or an aralkyl group having 7 to 15 carbon atoms, and $R^2$ and $R^3$ may be bonded together to form a 5- to 8-membered heterocyclic group together with an oxygen atom to which $R^3$ is bonded.

3. The method for producing a polymer according to claim 1, wherein the base in which the pKa of the conjugated acid is 12 or more is at least one selected from the group consisting of sodium hydroxide, potassium hydroxide, sodium methoxide, potassium methoxide, and diazabicycloundecene.

4. The method for producing a polymer according to claim 1, wherein the organic solvent used in the deprotection reaction is at least one selected from the group consisting of methanol, ethanol, isopropanol, propylene glycol monomethyl ether, methyl acetate, ethyl acetate, isopropyl acetate, propyl acetate, methyl propionate, ethylene glycol monomethyl ether acetate, ethylene glycol monoethyl ether acetate, and propylene glycol monomethyl ether acetate.

5. The method for producing a polymer according to claim 1, wherein the deprotection reaction is carried out at a temperature of 20° C. to 40° C.

6. The method for producing a polymer according to claim 2, wherein the base in which the pKa of the conjugated acid is 12 or more is at least one selected from the group consisting of sodium hydroxide, potassium hydroxide, sodium methoxide, potassium methoxide, and diazabicycloundecene.

7. The method for producing a polymer according to claim 2, wherein the organic solvent used in the deprotection reaction is at least one selected from the group consisting of methanol, ethanol, isopropanol, propylene glycol monomethyl ether, methyl acetate, ethyl acetate, isopropyl acetate, propyl acetate, methyl propionate, ethylene glycol monomethyl ether acetate, ethylene glycol monoethyl ether acetate, and propylene glycol monomethyl ether acetate.

8. The method for producing a polymer according to claim 3, wherein the organic solvent used in the deprotection reaction is at least one selected from the group consisting of methanol, ethanol, isopropanol, propylene glycol monomethyl ether, methyl acetate, ethyl acetate, isopropyl acetate, propyl acetate, methyl propionate, ethylene glycol monomethyl ether acetate, ethylene glycol monoethyl ether acetate, and propylene glycol monomethyl ether acetate.

9. The method for producing a polymer according to claim 2, wherein the deprotection reaction is carried out at a temperature of 20° C. to 40° C.

10. The method for producing a polymer according to claim 3, wherein the deprotection reaction is carried out at a temperature of 20° C. to 40° C.

11. The method for producing a polymer according to claim 4, wherein the deprotection reaction is carried out at a temperature of 20° C. to 40° C.

12. The method for producing a polymer according to claim 1, wherein the organic solvent used in the deprotection reaction comprises at least one selected from the group consisting of propylene glycol monomethyl ether, methyl acetate, ethyl acetate, isopropyl acetate, propyl acetate, methyl propionate, ethylene glycol monomethyl ether acetate, ethylene glycol monoethyl ether acetate, and propylene glycol monomethyl ether acetate.

13. The method for producing a polymer according to claim 2, wherein the organic solvent used in the deprotection reaction comprises at least one selected from the group consisting of propylene glycol monomethyl ether, methyl acetate, ethyl acetate, isopropyl acetate, propyl acetate, methyl propionate, ethylene glycol monomethyl ether acetate, ethylene glycol monoethyl ether acetate, and propylene glycol monomethyl ether acetate.

14. The method for producing a polymer according to claim 3, wherein the organic solvent used in the deprotection reaction comprises at least one selected from the group consisting of propylene glycol monomethyl ether, methyl acetate, ethyl acetate, isopropyl acetate, propyl acetate, methyl propionate, ethylene glycol monomethyl ether acetate, ethylene glycol monoethyl ether acetate, and propylene glycol monomethyl ether acetate.

* * * * *